United States Patent
Giambastiani et al.

(10) Patent No.: US 10,119,834 B2
(45) Date of Patent: Nov. 6, 2018

(54) MEMS SENSOR WITH VOLTAGE SENSING OF MOVABLE MASS

(71) Applicant: PANASONIC CORPORATION, Osaka (JP)

(72) Inventors: Adolfo Giambastiani, San Marco (IT); Jaakko Ruohio, Milan (IT)

(73) Assignee: PANASONIC CORPORATION, Osaka (JP)

(*) Notice: Subject to any disclaimer, the term of this patent is extended or adjusted under 35 U.S.C. 154(b) by 105 days.

(21) Appl. No.: 15/258,939

(22) Filed: Sep. 7, 2016

(65) Prior Publication Data

US 2017/0167874 A1  Jun. 15, 2017

Related U.S. Application Data

(60) Provisional application No. 62/265,925, filed on Dec. 10, 2015.

(51) Int. Cl.
    *G01C 25/00* (2006.01)
    *G01C 19/5712* (2012.01)
    *B81B 3/00* (2006.01)

(52) U.S. Cl.
    CPC ............ *G01C 25/00* (2013.01); *B81B 3/0021* (2013.01); *G01C 19/5712* (2013.01); *G01C 25/005* (2013.01); *B81B 2201/0242* (2013.01); *B81B 2203/0109* (2013.01)

(58) Field of Classification Search
    CPC .. G01C 25/00; G01C 25/005; G01C 19/5712; B81B 3/0021

USPC ....................................................... 73/504.12
See application file for complete search history.

(56) References Cited

U.S. PATENT DOCUMENTS

| | | | |
|---|---|---|---|
| 5,731,520 A | 3/1998 | Stevenson et al. | |
| 6,564,637 B1* | 5/2003 | Schalk ............... | G01C 19/5614 73/1.38 |
| 7,555,929 B2 | 7/2009 | Emmerich et al. | |
| 8,316,688 B2 | 11/2012 | Kimmerle et al. | |
| 9,846,037 B2* | 12/2017 | Aaltonen ........... | G01C 19/5726 |
| 2004/0187555 A1 | 9/2004 | Zarabadi | |
| 2013/0255377 A1 | 10/2013 | Furuhata et al. | |
| 2013/0340524 A1 | 12/2013 | Maeda et al. | |
| 2014/0250969 A1 | 9/2014 | Alagarsamy et al. | |

FOREIGN PATENT DOCUMENTS

| | | | |
|---|---|---|---|
| EP | 1004882 A2 | 5/2000 | |
| EP | 2317328 A2 | 5/2011 | |

* cited by examiner

*Primary Examiner* — David M Gray
*Assistant Examiner* — Andrew V Do
(74) *Attorney, Agent, or Firm* — McDermott Will & Emery LLP

(57) ABSTRACT

A suspended spring-mass system is suspended from a plurality of the anchoring points. A source voltage is provided from one of anchoring points to the suspended spring-mass system. The other anchoring points have measurement nodes which measure the voltage at those anchoring points. If a voltage other than the source voltage is received at one of the measurement nodes, an error is identified.

19 Claims, 6 Drawing Sheets

MEMS SENSOR WITH VOLTAGE SENSING OF MOVABLE MASS

BACKGROUND

Numerous items such as smart phones, smart watches, tablets, automobiles, aerial drones, appliances, aircraft, exercise aids, and game controllers may utilize motion sensors during their operation. In many applications, various types of motion sensors such as accelerometers and gyroscopes may be analyzed independently or together in order to determine varied information for particular applications. For example, gyroscopes and accelerometers may be used in gaming applications (e.g., smart phones or game controllers) to capture complex movements by a user, drones and other aircraft may determine orientation based on gyroscope measurements (e.g., roll, pitch, and yaw), and vehicles may utilize measurements for determining direction (e.g., for dead reckoning) and safety (e.g., to recognizing skid or roll-over conditions).

Many sensors such as accelerometers, gyroscopes, pressure sensors, and microphones are implemented as microelectromechanical systems (MEMS) sensors. Micromechanical components of the sensor are fashioned using silicon fabrication techniques, and those micromechanical components respond (e.g., move) in response to certain external stimuli that are measured by the sensor, based on the design of the particular micromechanical components. The response of the micromechanical component to the external stimuli may be measured, e.g., by measuring the relative distance between the moving micromechanical components and fixed components of the sensor.

MEMS sensors may be implemented with masses that are suspended and coupled to each other in a manner that supports the measurement of desired motion, such as linear acceleration along an axis or angular velocity about an axis. The masses are suspended via springs and are coupled to each other with the springs. Over time, some of the springs or masses may become worn or damaged. In some cases, the MEMS sensor may continue to operate despite the worn or damaged component, resulting in inaccurate measurements.

SUMMARY OF THE INVENTION

In an exemplary embodiment, a microelectromechanical sensor comprises a plurality of anchoring points and a suspended spring-mass system, the suspended spring-mass system comprising a plurality of movable masses and a plurality of springs coupling the plurality of movable masses to each other and to suspend the plurality of movable masses from the plurality of anchoring points, wherein the plurality of moving masses and the plurality of anchoring points are electrically connected by the plurality of springs. The microelectromechanical sensor also comprises a first voltage source coupled to apply a system voltage level to the suspended spring-mass system via a first anchoring point of the plurality of anchoring points, a measurement node coupled to a second anchoring point of the plurality of anchoring points to measure a voltage of the second anchoring point, and processing circuitry configured to identify an error of the suspended spring-mass system based on the measured voltage.

In an exemplary embodiment, a method for identifying an error within a microelectromechanical sensor comprises providing, from a first voltage source, a system voltage to a first anchoring point of a plurality of anchoring points, and applying, via the first anchoring point, a system voltage level to a suspended spring-mass system. The method further comprises receiving, at a second anchoring point of the plurality of anchoring points, a received voltage via the suspended spring-mass system, and providing the received voltage from the second anchoring point to a measurement node. The method further comprises identifying, by processing circuitry, an error of the suspended spring-mass system based on the received voltage at the measurement node.

In an exemplary embodiment, a microelectromechanical sensor comprises a plurality of anchoring points and a plurality of source/sense circuits coupled to the plurality of anchoring points, wherein each source/sense circuit comprises a voltage source, a measurement node, and a switch. The microelectromechanical sensor further comprises a suspended spring-mass system suspended from the plurality of anchoring points and processing circuitry configured to cause a first source/sense circuit to couple the voltage source of the first source/sense circuit to a first anchoring point of the plurality of anchoring points, to cause a second source/sense circuit couple a second anchoring point of the plurality of anchoring points to the measurement node of the second source/sense circuit, and to identify an error of the suspended spring-mass system based on a voltage received at the second measurement node.

BRIEF DESCRIPTION OF THE DRAWINGS

The above and other features of the present disclosure, its nature and various advantages will be more apparent upon consideration of the following detailed description, taken in conjunction with the accompanying drawings in which.

DETAILED DESCRIPTION

A MEMS device may constructed of a number of layers such as a bottom layer, a MEMS device layer, and a cap layer. The MEMS device layer may be electrically coupled to processing circuitry such as CMOS circuitry, which may be located external to the MEMS device, or in some embodiments, the bottom layer may be a CMOS layer including the CMOS circuitry. Although the present disclosure may describe an exemplary embodiment including a CMOS layer as the bottom layer, it will be understood that the embodiments described here may be similarly applicable to devices having the CMOS circuitry located external to the MEMS device (e.g., by providing wiring between anchoring points and the external circuitry to provide/receive voltages and signals as described herein).

The MEMS device layer includes a suspended spring-mass system that moves in response to forces such as linear acceleration or angular velocity. During operation, a voltage such as a system voltage is applied from the CMOS layer to the MEMS layer to facilitate the operation of the MEMS device, e.g., to drive components of the suspended spring-mass system and to provide for capacitive sensing. The voltage may be provided from the CMOS layer to the MEMS layer by anchoring points that are physically connected to the CMOS layer and that suspend the suspended spring-mass system of the MEMS layer.

A plurality of anchoring points may be coupled to different portions of the suspended spring-mass system. A source voltage such as the system voltage may be provided from one or more of these anchoring points. Under normal operating conditions when no components of the suspended spring-mass system are damaged, this voltage will be propagated through to the other anchoring points via the components of the suspended spring-mass system. These other anchoring points may function as measurement nodes that sense the voltage.

If components of the suspended spring-mass system are damaged the voltage sensed at one or more of the measurement nodes may not match the voltage provided from the voltage source. Thus, based on these measured voltages it may be possible to identify the existence of an error (e.g., damaged components), and in some instances, to determine which components are damaged. Based on this information it may be possible to identify and/or compensate for the error, and notifications may be provided.

In some instances, a source/sense circuit may be coupled to one or more of the anchoring points. A source/sense circuit may selectively couple an anchoring point to either a voltage source or a measurement node. By modifying which of the anchoring points are connected to voltage sources and measurement nodes, it may be possible to test different circuit paths through the suspended spring-mass system to better identify the source and nature of the error.

Figure 1:
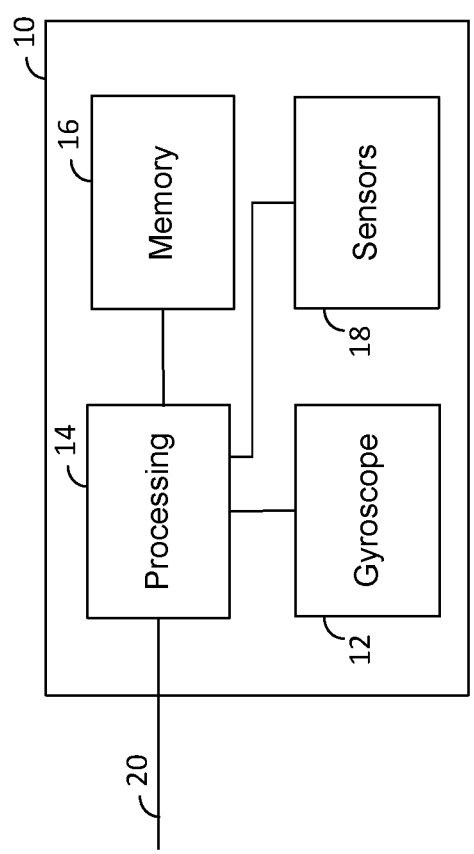
FIG. 1 shows an illustrative motion processing system in accordance with an embodiment of the present disclosure.

FIG. 1 depicts an exemplary motion processing system 10 in accordance with some embodiments of the present disclosure. Although particular components are depicted in FIG. 1, it will be understood that any suitable combination of sensors, processing components, memory, and other circuitry may be utilized as necessary for different applications and systems. In an embodiment as described herein, the motion processing system may include at least a MEMS gyroscope 12 and supporting circuitry, such as processing circuitry 14 and memory 16. In some embodiments, one or more additional sensors 18 (e.g., additional MEMS gyroscopes, MEMS accelerometers, MEMS microphones, MEMS pressure sensors, and a compass) may be included within the motion processing system 10 to provide an integrated motion processing unit ("MPU") (e.g., including 3 axes of MEMS gyroscope sensing, 3 axes of MEMS accelerometer sensing, microphone, pressure sensor, and compass).

Processing circuitry 14 may include one or more components providing necessary processing based on the requirements of the motion processing system 10. In some embodiments, processing circuitry 14 may include hardware control logic such as hardware control circuitry (e.g. digital, analog, or mixed signal) that may be integrated within a chip of a sensor (e.g., on a substrate or cap of a gyroscope 12 or other sensor 18, or on an adjacent portion of a chip to the gyroscope or other sensor) to control the operation of the gyroscope 12 or other sensor 18 and perform aspects of processing for the gyroscope 12 or other sensor 18, with or without on one or more memories 16 and processing circuitry external to the MEMS devices. In some embodiments, the gyroscope 12 and other sensors 18 may include one or more registers that allow aspects of the operation of hardware control logic to be modified (e.g., by modifying a value of a register). In some embodiments, processing circuitry 14 may also include a processor such as a microprocessor that executes software instructions, e.g., that are stored in memory 16. The microprocessor may control the operation of the gyroscope 12 by interacting with the hardware control logic, and process measurement signals received from gyroscope 12. The microprocessor may interact with other sensors in a similar manner.

Although in some embodiments (not depicted in FIG. 1), the gyroscope 12 or other sensors 18 may communicate directly with external circuitry (e.g., via a serial bus or direct connection to sensor outputs and control inputs), in an embodiment the processing circuitry 14 may process data received from the gyroscope 12 and other sensors 18 and communicate with external components via a communication interface 20 (e.g., a SPI or I2C bus, or in automotive applications, a controller area network (CAN) or Local Interconnect Network (LIN) bus). The processing circuitry 14 may convert signals received from the gyroscope 12 and other sensors 18 into appropriate measurement units (e.g., based on settings provided by other computing units communicating over the communication bus 20) and perform more complex processing to determine measurements such as orientation or Euler angles, and in some embodiments, to determine from sensor data whether a particular activity (e.g., walking, running, braking, skidding, rolling, etc.) is taking place.

In some embodiments, certain types of information may be determined based on data from multiple gyroscopes 12 and sensors 18, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

A MEMS gyroscope may typically have a plurality of micromechanical components that are used in order to measure rotation about an axis (e.g., pitch, roll, and/or yaw). The micromechanical components may include a plurality of masses, combs, electrodes, levers, arms, springs, and other similar components, situated in a device plane of the gyroscope. In some embodiments, the masses may be suspended in the device plane. One or more of the micromechanical components are caused to vibrate, typically through an electrostatic drive system such as drive electrodes or drive combs. The components (e.g., a drive mass) are caused to vibrate at a drive frequency in a drive axis. Although it may be possible to measure rotation from the drive mass, in many gyroscopes a number of masses (e.g., Coriolis masses, proof masses, sense masses, etc.) are coupled to each other by springs which often restrict the freedom of motion of the masses in certain directions based on the spring design and placement.

A mass that is vibrating in the drive axis may experience a force as a result of rotation of gyroscope about an axis. This Coriolis force is imparted on the mass along an axis (i.e., the sense axis) that is perpendicular to both the drive axis and the axis about which the gyroscope is rotating. When a mass (e.g., a sense mass) that experiences a Coriolis force is free to move in the sense axis (e.g., based on the configuration of the mass and springs), this sense mass will oscillate in the sense axis. In an exemplary yaw-rate MEMS gyroscope, masses are caused to oscillate in the first axis in response to the drive motion in that axis. A yaw rotation about an axis that is perpendicular to the device plane results in a Coriolis force in the device plane, and perpendicular to both the drive axis and the axis of rotation. The angular velocity of the gyroscope is measured based on the motion of the sense mass relative to a fixed sensor. In some embodiments, the sensing may be performed by electrodes such as combs or plates.

An exemplary MEMS accelerometer (e.g., of sensors 18) may include one or more masses and springs that are configured in a manner that permits the MEMS accelerometer to measure linear acceleration along an axis. In some embodiments, the one or more masses may be suspended and coupled in a manner such that the masses move in response to linear acceleration along a sensing axis. The movement of the masses relative to a fixed surface (e.g., a fixed electrode) along the sensing axis in response to linear acceleration is measured and scaled to determine linear acceleration.

As described above, exemplary MEMS devices include movable masses suspended and coupled to each other by springs. The movable masses may be suspended from anchoring points, which as described herein, may refer to any portion of the MEMS sensor which is fixed, such as an anchor that extends from a layer (e.g., a CMOS layer) that is parallel to the MEMS layer of the device, a frame of the MEMS layer of the device, or any other suitable portion of the MEMS device that is fixed relative to the movable masses. In an embodiment, the movable masses, and the springs that suspend the movable masses from the anchoring points and couple the movable masses to each other, may be referred to as a suspended spring-mass system.

In an embodiment, the suspended spring-mass system may be suspended from a plurality of anchoring points. If a voltage is applied to one component of the suspended spring-mass system it will propagate through the spring-mass system as long as a path exists through a spring or mass. In an embodiment, at least some of the plurality of anchoring points may be connected to one or more layers of MEMS device (e.g., a shared CMOS layer) such that the anchoring points are electrically isolated from each other. Thus, a voltage applied to a first anchoring point may not be received at other anchoring points unless there is a path through the springs and movable masses of the suspended spring-mass system. In some embodiments, measurement nodes may be coupled to one or more of the other anchoring points to determine whether the voltage that was applied at the first anchoring point was received at the other anchoring points.

In some embodiments, when the applied voltage is not received at one of the measurement nodes this may be indicative that a component of the suspended spring-mass system that forms the circuit path between the anchoring point where the voltage was applied and the measurement node is broken, for example, due to a damaged spring or mass. In an embodiment, it can be determined that the damaged component is a certain component or one of a subset of components, based on a known limited number of components that define the circuit path. The subset of components may be further refined based on measurements from multiple measurement nodes. Based on whether the applied voltage was received at the additional measurement nodes and the circuit paths associated with those measurement nodes, it may be possible to identify or rule out certain components as being the damaged components (e.g., in an iterative process to identify a subset of components and then to apply different circuit paths to test those components).

In an embodiment, the anchoring point that is used to apply the voltage may be changed. Based on the configuration of the suspended spring-mass system, there may be certain circuit paths that may not be identified based on the voltage being applied to the initial anchoring point. Changing to a different anchoring point to apply the voltage may allow the testing of these other circuit paths. In some embodiments, by applying the voltage to different anchoring points, different circuit paths may be tested to refine the identified damaged component or components. In embodiments, some or all of the anchoring points may include a switch (e.g., any suitable switching element such as a transistor, relay, MOSFET, etc.) that may be controlled (e.g., by hardware control logic of the MEMS sensor or a processing circuitry 14) to selectively apply the voltage to a particular anchoring point or to couple the particular anchoring point to a measurement node. In this manner, additional testing configurations may be applied.

In some embodiments, the acquired information may be used to determine a corrective action for the MEMS device. In some embodiments, the MEMS device may continue to operate in some manner despite a damaged component (e.g., a partially redundant spring or secondary mass-spring sub systems that have small impact to overall performance). A scaling factor, drive force, or other operational parameter of the MEMS device may be utilized to modify the operation of the MEMS device. In some embodiments, information may be determined and collected to identify failure modes of the MEMS device. For example, the determination of the failed component may be provided to the processing circuitry 14 and via the processing circuitry 14 to a data analysis and storage system that identifies and analyzes failures based on a large amount of data acquired over time. Such information may be utilized to modify a design or update design practices. In some embodiments the information about damaged components may be combined with other information about how the sensor was operating at the time the damage was detected to further identify failure modes and causes (e.g., based on sensed linear acceleration or angular velocity).

Figure 2:
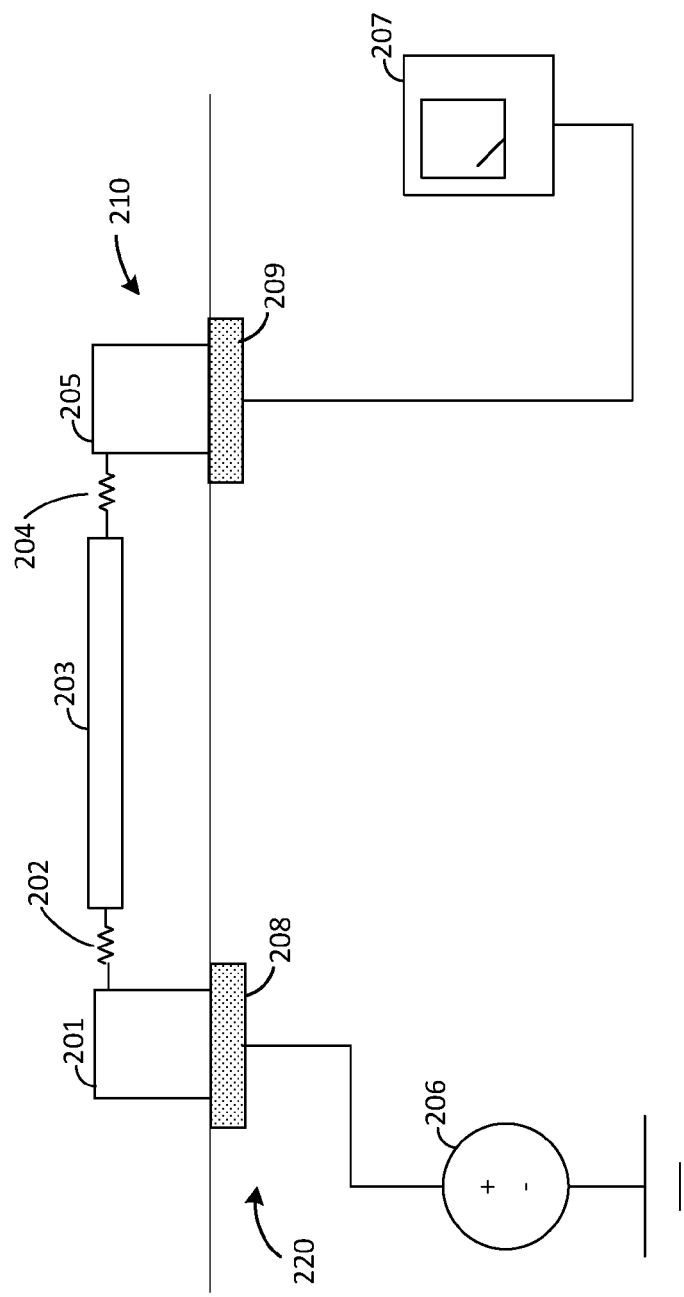
FIG. 2 shows an illustrative spring-mass system with voltage sensing of a movable mass in accordance with some embodiments of the present disclosure.

FIG. 2 depicts an illustrative spring-mass system with voltage sensing of a movable mass in accordance with some embodiments of the present disclosure. Although particular components are depicted and configured in a particular manner in FIG. 2, it will be understood that a spring-mass system may include other suitable components and configuration.

In the embodiment of FIG. 2, the spring-mass system is implemented as a MEMS device constructed of a plurality of bonded semiconductor layers. Although a MEMS device may be constructed in a variety of manners, in an embodiment, the MEMS device may include a CMOS layer 220, a MEMS layer 210, and a cap layer (not depicted) that are bonded together at certain points to form a hermetically sealed package. An exemplary MEMS layer may be produced using semiconductor manufacturing techniques to construct micromechanical components for use in applications such as MEMS sensors (e.g., accelerometers, gyroscopes, pressure sensors, microphones, etc.). An exemplary CMOS layer may provide for the integration of electrical components and devices within the CMOS layer, and may also provide for interconnections between those components. In some embodiments, the components of the MEMS layer may be conductive, and interconnections between components of the MEMS layer and the CMOS layer may be provided.

In an exemplary embodiment, the MEMS layer may include anchoring points 201 and 205, springs 202 and 204, and mass 203. Each of the anchoring points 201 and 205 may be fixedly attached (e.g., bonded) to the CMOS layer 220 while also extending into the plane of the MEMS spring-mass system. Spring 202 may connect the anchoring point 201 to the mass 203, while spring 204 may connect anchoring point 205 to mass 203. Collectively, the spring 202, mass 203, and spring 204 may function as a suspended spring-mass system in which the springs suspend the mass in the plane of the MEMS spring-mass system. Each of the components within the MEMS layer 210 is conductive, such that a voltage applied to any one component will also be applied to any other components for which a circuit path exists. In the embodiment of FIG. 2, unless one of the components within the MEMS layer 210 is damaged or broken, a voltage applied to any of the components will also be applied to the other components within the MEMS layer 210. For example, a voltage applied to the anchoring point 201 will be applied to spring 202; via anchoring point 201 and spring 202 to mass 203; via anchoring point 201, spring 202, and mass 203 to spring 204; and via anchoring point 201, spring 202, mass 203, and spring 204 to anchoring point 205. Only if a component within this circuit path is damaged or broken will a different voltage be applied at any of these components.

In an embodiment, a circuit layer such as CMOS layer 220 may include voltage source 206, measurement node 207, and connection points 208 and 209. Although the voltage source 206 may be any suitable voltage source, in exemplary MEMS sensors a voltage may be applied to the suspended spring-mass system such that the spring-mass system may be electrostatically driven and/or such that movement of components within the spring-mass system may be capacitively sensed. This MEMS system voltage level may be provided in any suitable manner, e.g., from an external or internal source, regulator, or circuit of the CMOS layer 220. In some embodiments, the voltage source 206 may provide unique test signals (e.g., having different or varying voltages, or signals at frequency) rather than the MEMS system voltage at certain times, for example, to test the components of the suspended spring-mass system as described herein.

A measurement node 207 may be any suitable components to measure a signal or electrical voltage, such as amplifiers, comparators, filters, analog-to-digital converters, frequency filters, etc. As described herein, in some embodiments the measurement node 207 may monitor for a MEMS system voltage. In some embodiments, test voltages or signals may be provided and the measurement mode 207 may measure these signals. The measurement node 207 may also include processing circuitry (e.g., hardware control logic including analog or digital hardware control circuitry and/or other processing circuitry 14) to compare the received signal to thresholds or perform other signal analysis such as measuring responses to different voltages or signals.

In the exemplary embodiment of FIG. 2, voltage source 206 may provide the source voltage (e.g., the MEMS system voltage) to the connection point 208, which may provide an electrical connection to anchoring point 201. The source voltage may thus be provided to the components of the MEMS layer 210 that are connected via a circuit path to anchoring point 201 (e.g., spring 202, mass 203, spring 204, and anchoring point 205). Anchoring point 205 may be bonded to provide an electrical connection to connection point 209, which in turn is connected to measurement node 207. If the source voltage is received properly at the measurement node 207 (e.g., the received voltage is within a threshold of the MEMS system voltage, or the received signal matches a transmitted signal within certain thresholds), it may be determined that the circuit path between the anchoring point 201 and the anchoring point 205 is not broken. This may ensure not only that the anchoring points 201/205, springs 202/204, and mass 203 system are not damaged, but also that the connection points 208 and 209 are not damaged as well.

In some instances the source voltage will not be properly received at the measurement node 207 (e.g., the received voltage is not within a threshold of the MEMS system voltage, or the received signal fails to match patterns of the transmitted signal within certain thresholds). A failure to receive the source voltage at the measurement node may demonstrate that it is likely that a component within the suspended spring-mass system is damaged. Although it cannot be excluded, it may be unlikely that an electrical interconnection within the CMOS layer will be damaged or broken, and the anchoring points 201 and 205 are physically attached to the CMOS layer and are stationary. The suspended spring-mass system, in contrast, may be frequently caused to move in response to external forces, the movement of which is more likely to damage components within the spring-mass system.

In some embodiments, different types of damage to components within the spring-mass system may have different impacts on a received signal at the measurement node 207. For example, if a component such as a spring is physically broken in a manner such that circuit path between the voltage source 206 and the measurement node is broken, the source voltage will not be sensed at the measurement node. In some embodiments, multiple paths may be possible from voltage source 206 to measurement nodes 207. A partial voltage drop between the source voltage and the voltage at the measurement node 207 may be indicative of damaged components, and changes over patterns of voltages or a frequency response to test patterns may similarly be indicative of damaged components.

If an error is identified by the measurement node 207 and processing circuitry, notifications may be provided and corrective action may be taken. In some embodiments, notifications may provide an identification of an error (e.g., a broken spring, damaged sensor, predicted extent of the damage, damaged connection points etc.), the measured values that resulted in the error, other measurements from the sensor (e.g., a set of recently sensed values that may be used to identify a cause of the error, etc.), any other suitable information, or any combination thereof. Corrective action may include stopping operation of the MEMS device, or in some embodiments, compensating for the identified damage (e.g., by modifying drive voltages, scaling factors, applying countervailing forces from electrodes, etc.).

Figure 3:
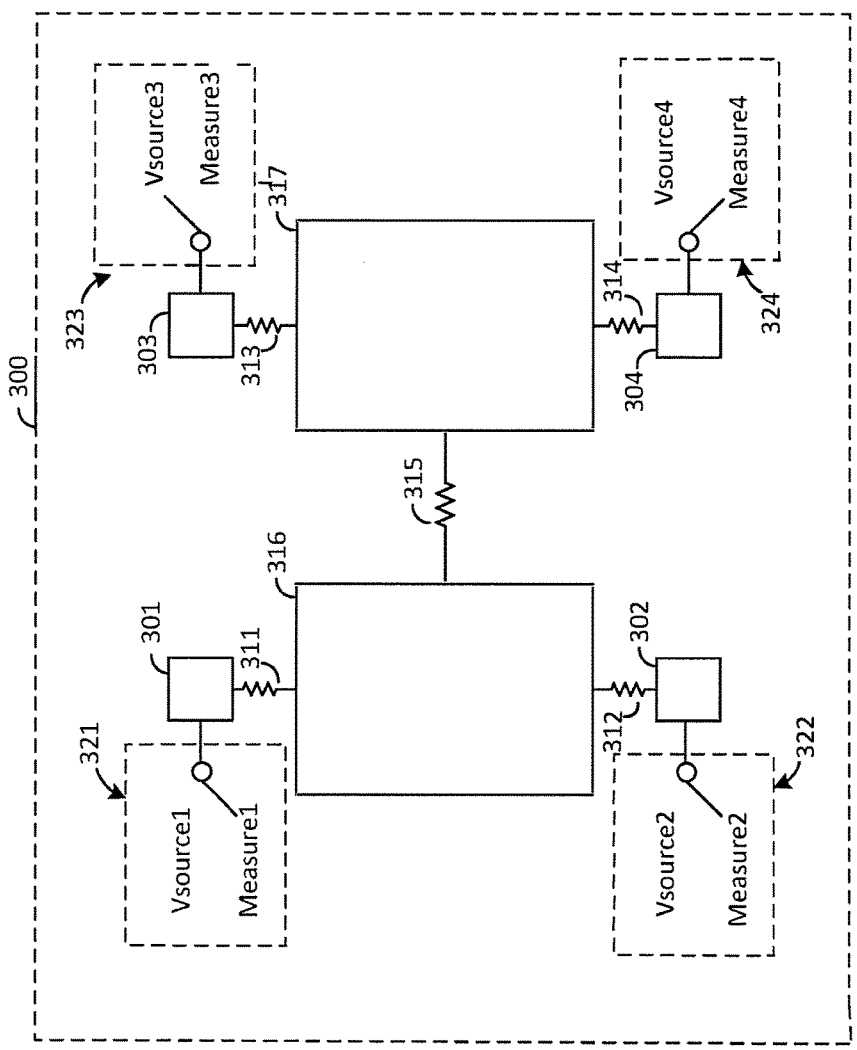
FIG. 3 shows an illustrative spring-mass system with voltage sensing of multiple movable masses in accordance with some embodiments of the present disclosure.

FIG. 3 depicts an illustrative spring-mass system with voltage sensing of multiple movable masses in accordance with some embodiments of the present disclosure. Although particular components are depicted and configured in a particular manner in FIG. 3, it will be understood that a spring-mass system may include other suitable components and configuration.

The spring-mass system of FIG. 3 is depicted from a top view, with a CMOS layer 300 underlying a MEMS layer. A plurality of voltage sources, measurement nodes, and switches may be located within the CMOS layer 300, as depicted by source/sense circuits 321, 322, 323, and 324 in FIG. 3. Anchoring points 301, 302, 303, and 304 may be bonded to the CMOS layers (e.g., at the locations of associated connecting points) and may be electrically connected to respective source/sense circuits 321, 322, 323, and 324. The anchoring points may be part of the MEMS layer and may extend vertically into the plane of the suspended spring-mass system of the MEMS layer, which may include springs 311, 312, 313, 314, and 315 and masses 316 and 317. As depicted in FIG. 3, spring 311 may connect anchoring point 301 to mass 316, spring 312 may connect anchoring point 302 to mass 316, spring 313 may connect anchoring point 303 to mass 317, spring 314 may connect anchoring point 304 to mass 317, and spring 315 may connect mass 316 to mass 317. Under normal conditions, the components of the suspended spring-mass system may be connected to form an electrical circuit such that a voltage applied at any point of the suspended spring-mass system is also applied at all other points.

In an exemplary embodiment, one or more of the anchoring points may be connected to source/sense circuits, which may selectively connect an anchoring point to either a voltage source or a measurement node. Although a source/sense circuit may be implemented in any suitable manner, in an embodiment the source/sense circuit may be electrically connected to both a voltage source and a measurement node, and a switch may be controlled (e.g., by hardware control logic and/or processing circuitry) to selectively connect the anchoring point to one of the voltage source or the measurement node. As described herein, a switch may include any suitable circuit or device or combination thereof that facilitates selection between a voltage source and a measurement node, such as a switching element, one or more transistors, one or more MOSFETS, any other suitable switching circuits, or any suitable combination thereof.

In the exemplary embodiment of FIG. 3, each of the anchoring points 301, 302, 303, and 304 may be connected to a respective source/sense circuit 321, 322, 323, and 324. In an embodiment, each of the voltage sources of the source/sense circuits (e.g., voltage source 1, voltage source 2, voltage source 3, and voltage source 4) may be connected to a common source, although in some embodiments different sources may be associated with different ones of the voltage sources. Although the source voltage may be applied to the suspended spring-mass system in any suitable manner, in an embodiment only one of the source/sense circuits 321, 322, 323, and 324 (e.g., source/sense circuit 323 in FIG. 3) may have the switch set to couple to the voltage source. The source voltage may be applied to the suspended spring/mass system via anchoring point 303, and if none of the components of the suspended spring-mass system are damaged, provided to the measurement nodes of each of the source/sense circuits 321, 322, and 324 via the circuit paths of the suspended spring-mass system and associated anchoring points. In the embodiment of FIG. 3, the measurement node of source/sense circuit 321 may receive the source voltage via spring 313, mass 317, spring 315, mass 316, spring 311, and anchoring point 301. The measurement node of source/sense circuit 322 may receive the source voltage via spring 313, mass 317, spring 315, mass 316, spring 312, and anchoring point 302. The measurement node of source/sense circuit 324 may receive the source voltage via spring 313, mass 317, spring 314, and anchoring point 304.

If the source voltage is not properly received at one of the measurement nodes, this may provide an indication that one or more components of the suspended sense-mass system are damaged. For example, if the source voltage is not received at the measurement node of source/sense circuit 321, this may indicate that one of the anchoring point 303, spring 313, mass 317, spring 315, mass 316, spring 311, or anchoring point 301 is damaged. If the source voltage is not received at the measurement node of source/sense circuit 322, this may indicate that one of the anchoring point 303, spring 313, mass 317, spring 315, mass 316, spring 312, or anchoring point 302 is damaged. If the source voltage is not received at the measurement node of source/sense circuit 324, this may indicate that one of the anchoring point 303, spring 313, mass 317, spring 314 or anchoring point 304 is damaged.

The damaged components may be further identified by considering and comparing all of the received signals of the monitoring nodes. For example, if both of the measurement nodes of source/sense circuit 321 and 322 do not receive the source voltage, but the measurement node of source/sense circuit 324 does receive the source voltage, this may indicate that spring 313 is not damaged (e.g., based on the source voltage being received at the measurement node of source/sense circuit 324 via spring 313), and that it is likely that spring 315 is damaged (e.g., since it is unlikely that both of springs 311 and 312 would be damaged at the same time).

The switches of the source/sense circuit may be modified such that the source voltage is being provided from a different one of the source/sense circuits. In some embodiments, this may be performed after an error is initially identified based on one or more of the measurement nodes, e.g., to better identify which of the components of the suspended-spring-mass system are damaged. In the exemplary embodiment described above, the source/sense circuit 321 may switch to providing the source voltage, while the source/sense circuit 323 may connect the anchoring point 303 to measurement node 3. If the voltage is sensed at measurement node 2 via spring 311, mass 316, and spring 312, this may confirm that neither of springs 311 nor 312 is damaged. Further, if the source voltage is not sensed at either measurement node 3 of source/sense circuit 323 and measurement node 4 of source/sense circuit 324, this may confirm that spring 315 is the spring that is damaged. In a similar manner, the source voltage may be provided via any suitable anchoring points as is necessary to identify one or more components that are likely to be damaged.

Figure 4:
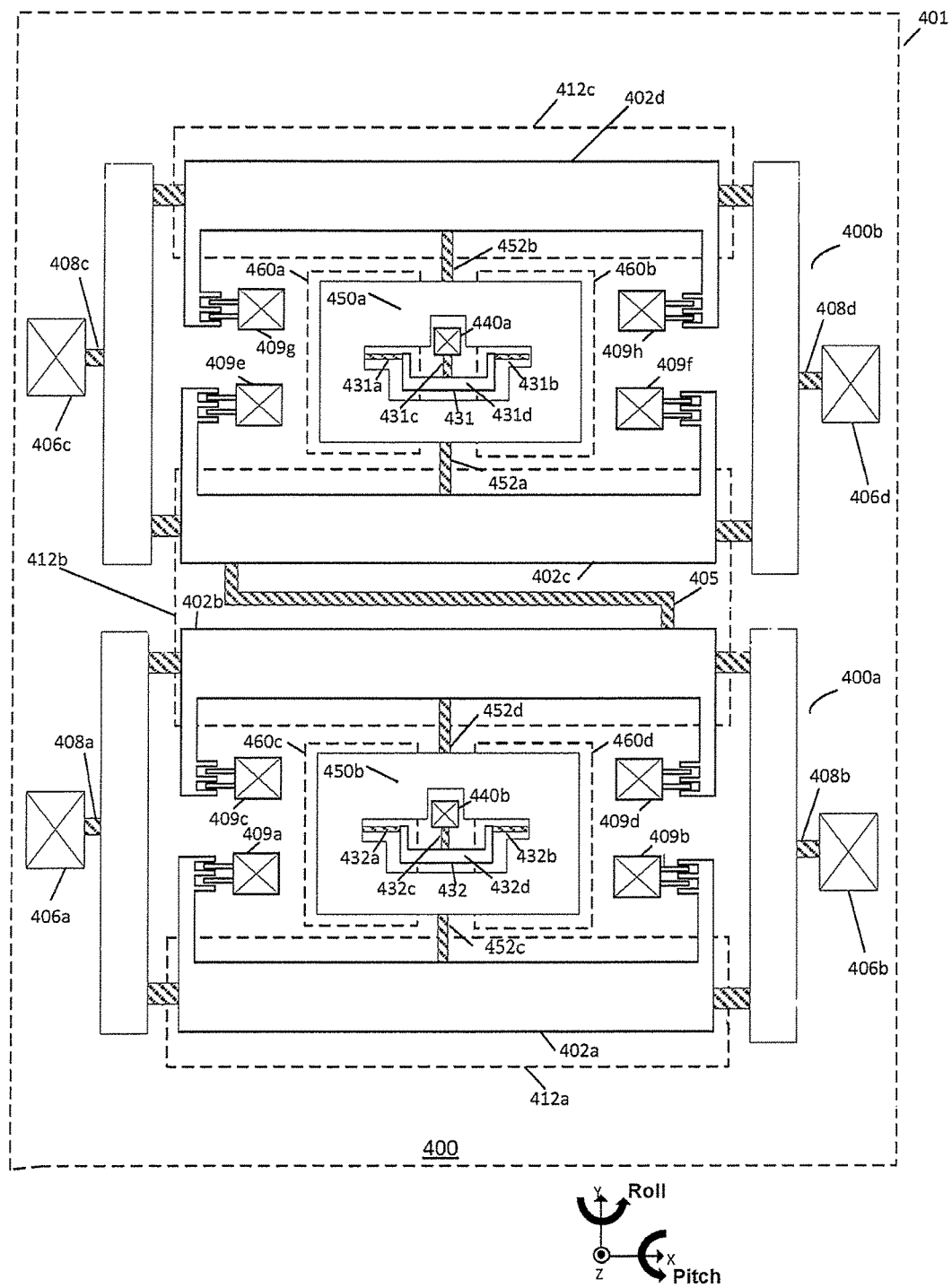
FIG. 4 shows an illustrative MEMS gyroscope with voltage sensing of multiple movable masses in accordance with some embodiments of the present disclosure.

FIG. 4 depicts an illustrative MEMS gyroscope with voltage sensing of multiple movable masses in accordance with some embodiments of the present disclosure. The gyroscope design of FIG. 4 is provided for purposes of illustration and not limitation. It will be understood that the principles of the present disclosure may apply to any suitable MEMS device (e.g., MEMS accelerometers, gyroscopes, pressure sensors, microphones, etc.) and to any suitable configuration of such devices. The exemplary embodiment of FIG. 4 illustrates an embodiment of a dual-axis gyroscope comprising a balanced guided mass system 400. The guided mass system 400 comprises two guided mass systems 400a and 400b coupled together by coupling spring 405.

The guided mass systems 400a and 400b are connected to anchoring points 406a-d via springs 408a-d. Additional anchoring points 440a and 440b are located within the interior of the pitch proof masses 450a and 450b. Located below the MEMS layer of the suspended spring-mass system depicted in FIG. 4 is a CMOS layer 401. Each of the anchoring points 406a-d and 440a-b may be bonded to the CMOS layer 401 (e.g., via respective connecting points) and may extended upwards into the plane of the suspended spring-mass system. Although the anchoring points 406a-d and 440*a-b* may be coupled to any suitable circuitry within the CMOS layer 401, in an exemplary embodiment each of the anchoring points 406*a-d* and 440*a-b* may be electrically connected to a respective source/sense circuit (not depicted in FIG. 4) to selectively attach the anchoring point to a voltage source or a measurement node.

The symmetric guided mass system 400*a* rotates out-of-plane about a first roll-sense axis. The symmetric guided mass system 400*b* rotates out-of-plane about a second roll-sense axis in-plane and parallel to the first roll-sense axis. The coupling spring 405 is connected to roll proof-masses 402*b* and 402*c*. The coupling spring 405 is torsionally compliant about an axis in the X-direction so that the symmetric guided mass systems 400*a* and 400*b* can rotate anti-phase out-of-plane about the first and second roll-sense axes. The coupling spring 405 is stiff in the Z-direction which prevents the symmetric guided mass systems 400*a* and 400*b* from rotating in-phase out-of-plane.

In an embodiment, pitch proof-masses 450*a* and 450*b* are each flexibly connected to their respective four roll proof-masses 402*a*-402*d* via springs 452*a-d*. Springs 452*a* and 452*b* are torsionally compliant such that pitch proof-mass 450*a* can rotate out-of-plane about a first pitch sense axis in the Y-direction, and springs 452*c* and 452*d* are torsionally compliant such that pitch proof-mass 450*b* can rotate out-of-plane about a second pitch sense axis in the Y-direction.

In this embodiment, proof masses 450*a* and 450*b* are also coupled to the CMOS layer 401 via spring systems 431 (431*a*-431*d*) and 432 (432*a*-432*d*), and anchoring points 440*a* and 440*b*, respectively. Pitch proof-masses 450*a* and 450*b* follow the motion of the CMOS layer 401 substrate and the vertical gap between the substrate and the proof masses remain same even under the external effects like temperature variations and externally applied forces.

The two symmetric guided mass systems 400*a* and 400*b* are arranged so that the roll proof-masses 402*a-d* all move in the X-direction. The coupling spring 405 is stiff in the X-direction such that roll proof-masses 402*b* and 402*c* move together in the X-direction. The roll proof-masses 402*a* and 402*d* move in opposite of roll proof-masses 402*b* and 402*c*.

Springs 452*a-d* are compliant in-plane such that when the roll proof-masses 402*a-d* are driven, the pitch proof-masses 450*a* and 450*b* rotate anti-phase in-plane about separate axes in the Z-direction. Electrostatic actuators 409*a-h* such as comb drives, are connected to the roll proof-masses 402*a-d* to drive the balanced guided mass system 400. The two guided mass systems 400*a* and 400*b* comprising roll proof-masses 402*a-d* and pitch proof-masses 450*a* and 450*b* are driven together at a frequency by a drive circuit coupled to the actuators 409*a-h*.

Angular velocity about the pitch-input axis in the X-direction will cause Coriolis forces to act on the pitch proof-masses 450*a* and 450*b* about the first and second pitch-sense axes respectively. The Coriolis forces cause the pitch proof masses 450*a* and 450*b* to rotate anti-phase out-of-plane about the first and the second pitch-sense axes. The amplitudes of the rotations of the pitch proof-masses 450*a* and 450*b* about the first and the second pitch-sense axes are proportional to the angular velocity about the pitch-input axis.

In an embodiment, transducers 460*a*-460*d* under the pitch proof masses 450*a* and 450*b* are used to detect the anti-phase rotations about the first and the second pitch-sense axes. Externally applied angular acceleration about the roll-input axis will generate inertial torques in-phase on the pitch proof masses 450*a* and 450*b* causing them to rotate in-phase about the first and the second pitch-sense axes. Transducers 460*a* and 460*d* can be coupled and transducers 460*b* and 460*c* can be coupled so that in-phase rotations of the pitch proof-masses 450*a* and 450*b* are not detected, but anti-phase rotations are detected.

Angular velocity about the roll-input axis will cause Coriolis forces to act on the roll proof-masses 402*a-d* in the Z-direction. The Coriolis forces cause the symmetric guided mass systems 400*a* and 400*b* to rotate anti-phase out-of-plane about the first and second roll-sense axes. Transducers 412*a-c* under the roll proof masses 402*a-d* are used to detect the rotations of the symmetric guided mass systems 400*a* and 400*b*. Externally applied angular acceleration about the pitch-input axis will generate in-phase inertial torques on the symmetric guided mass systems 400*a* and 400*b*.

However, the symmetric guided mass systems 400*a* and 400*b* do not rotate because coupling spring 405 prevents in-phase rotation about the first and second roll-sense axes. Transducers 412*a* and 412*c* can be coupled so that in-phase rotations of the symmetric guided mass systems 400*a* and 400*b* are not detected but anti-phase rotations are detected.

If any of the components of the suspended spring-mass system of FIG. 4 is damaged, the ability of one or more of the roll proof masses 402*a-d* or pitch proof masses 450*a-b* to correctly respond to a rotation about the roll or pitch axis may be compromised. Accordingly, a source voltage may be provided to the suspended spring-mass system from one of the anchoring points 406*a-c* and 440*a-b* and a monitoring node associated with each of other anchoring points 406*a-c* and 440*a-b* may monitor for that source voltage. If an improper monitoring voltage is sensed at any of the monitoring nodes (e.g., based on a threshold compared to a MEMS system voltage, a variety of thresholds associated with different error modes (e.g., voltage drops), or signal analysis of a signal having frequency content), an error may be identified as described herein, notifications may be provided, and in some embodiments, corrective actions may be taken as necessary.

In an embodiment, each of the anchoring points 406*a-c* and 440*a-b* may be connected to a source/sense circuit such that any of the anchoring points 406*a-c* and 440*a-b* may provide source voltage. By applying the source voltage at a variety of different anchoring points 406*a-c* and 440*a-b* and sensing at measurement nodes associated with the other anchoring points, it may be possible to further isolate which of the components of the suspended spring-mass system are damaged.

Figure 5:
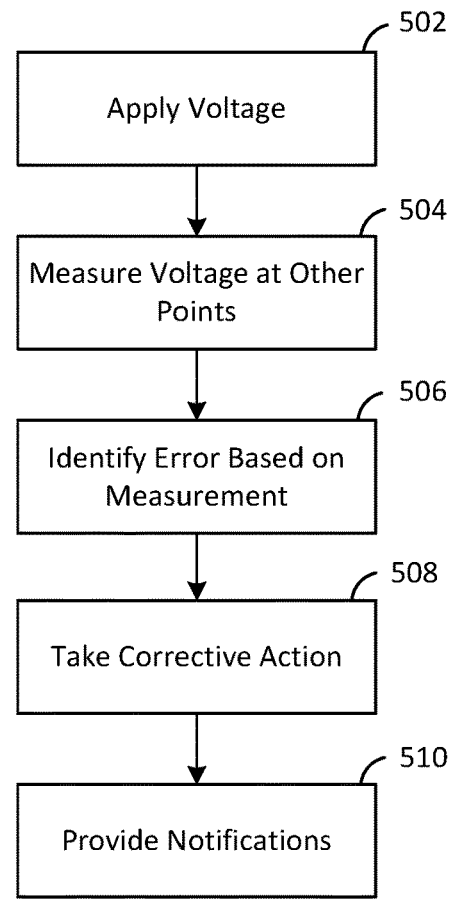
FIG. 5 shows exemplary steps for sensing a voltage of movable masses of a spring-mass system in accordance with some embodiments of the present disclosure.
Figure 6:
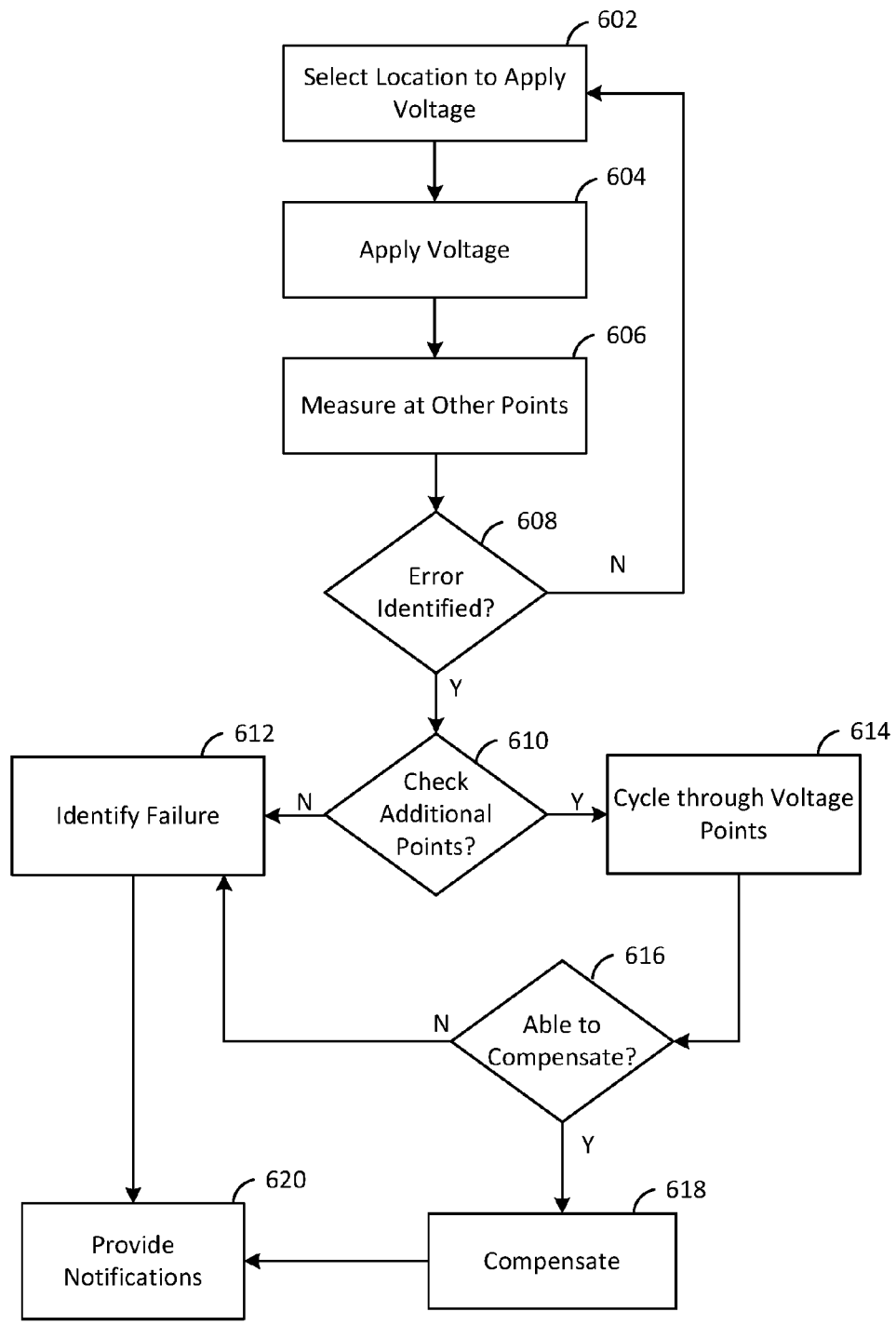
FIG. 6 shows exemplary steps for sensing a voltage of movable masses of a spring-mass system having a plurality of sense/source circuits in accordance with some embodiments of the present disclosure.

FIGS. 5-6 depict exemplary steps for testing for damage of components within a suspended spring-mass system in accordance with some embodiments of the present disclosure. Although FIGS. 5-6 are described in the context of the present disclosure, it will be understood that the methods and steps described in FIGS. 5-6 may be applied to any suitable suspended spring-mass system. Although a particular order and flow of steps is depicted in FIGS. 5-6, it will be understood that in some embodiments one or more of the steps may be modified, moved, removed, or added, and that the flow depicted in FIGS. 5-6 may be modified.

FIG. 5 depicts exemplary steps for sensing a voltage of movable masses of a spring-mass system in accordance with some embodiments of the present disclosure. At step 502, a source voltage may be applied from a voltage source to the suspended spring-mass system. Although as described herein the source voltage may be a suitable voltage, pattern of voltages, or signal having frequency content, in an exemplary embodiment the source voltage may be a system voltage that is applied during normal operation of the device (e.g., a MEMS gyroscope or accelerometer) to facilitate driving and/or sensing of components of the suspended spring-mass system. In an embodiment, the source voltage may be applied via an anchoring point such as an anchor that extends vertically from a CMOS layer where the voltage source is provided into a MEMS device plane where the suspended spring-mass system is located. Once the source voltage is applied, processing may continue to step 504.

At step 504, a voltage may be measured at one or more measurement nodes. When a source voltage is applied to the suspended spring-mass system, the conductive components of that system will receive the applied voltage under normal conditions. If components are broken or damaged, one or more portions of the suspended spring-mass system may be isolated from the applied system voltage such that the system voltage is not received, or such that a voltage drop occurs. Any anchoring points that are connected via these isolated components will not receive the system voltage, and the received voltage may be sensed by measurement nodes located within the CMOS layer and connected to the anchoring points. Once the voltages at the measurement nodes are determined, processing may continue to step 506.

At step 506, the processing circuitry (e.g., hardware control logic such has hardware control circuitry of the processing circuitry) may identify an error based on the measured values at the monitoring nodes. In an embodiment, identifying an error may include determining that damage has occurred to the suspended spring-mass system and connection points, as well as identifying likely failed components within the suspended spring-mass system and connection points. For example, based on measurements from multiple measurement nodes it may be possible to identify particular components of the suspended spring-mass system that are damaged as described herein, and in some embodiments, to identify the extent of the damage to those components. Processing may then continue to step 508.

At step 508, a corrective action may be taken based on the identification of an error. In some embodiments, the corrective action may be based on the damaged components and/or severity determined at step 506, and may include actions such as stopping the operation of the MEMS device or compensating for the operation of the MEMS device (e.g., modifying drive forces, changing sense scaling factors, etc.). In some embodiments such as a multi-axis gyroscope or accelerometer, it may be possible to continue to operate and measure certain axes that are isolated from the damaged components. For multi-axis devices (e.g., including three axes of gyroscope sensing and three axes of accelerometer sensing), sensor fusion may be used to estimate values for a missing axis or to compensate based on measured values from an axis including one or more damaged components. Once any corrective action has been taken at step 508, processing may continue to step 510.

At step 510, a notification may be provided indicating that an error has occurred within the suspended spring-mass system. In an embodiment, a notification may be provided indicating information such as the type of error, identification of damaged components, measured values for drive and sense forces (including from other sensors/axes) at a time preceding and including when the components were damaged, compensation techniques employed, other suitable information relating to the MEMS device including the suspended spring-mass system, and any suitable combination thereof. In some embodiments, the notifications may be provided to a remote system that determines information about a variety of sensors to identify failure modes, modifies compensation techniques, and performs other analysis based on long-term trends of information relating to failures that may be identified from the notifications. Once the notification is provided, the steps of FIG. 5 may end.

FIG. 6 depicts exemplary steps for sensing a voltage of movable masses of a spring-mass system having a plurality of source/sense circuits in accordance with some embodiments of the present disclosure. In an exemplary embodiment of FIG. 6, each of a plurality of anchoring points may be coupled to a respective source/sense circuit in a manner such that each anchoring point may be selectively coupled to function as either a voltage source or a measurement node.

At step 602, an anchoring point may be selected to function as a voltage source. In an embodiment, the remaining anchoring points may be selected to function as measurement nodes. The source/sense circuit for the anchoring point that is to function as the voltage source may couple that anchoring point to the voltage source, while the remaining source/sense circuits may couple their respective anchoring points to respective measurement nodes. Processing may then continue to step 604.

At step 604, a source voltage may be applied from the voltage source to the suspended spring-mass system. Although as described herein the source voltage may be a suitable voltage, pattern of voltages, or signal having frequency content, in an exemplary embodiment the source voltage may be a system voltage that is applied during normal operation of the device (e.g., a MEMS gyroscope or accelerometer) to facilitate driving and/or sensing of components of the suspended spring-mass system. In an embodiment, the anchoring point that is connected to supply the source voltage via its source/sense circuit may extend vertically from a CMOS layer where the source/sense circuit and voltage source are located into a MEMS device plane where the suspended spring-mass system is located. Once the source voltage is applied, processing may continue to step 606.

At step 606, a voltage may be measured at each of the measurement nodes that are connected to the suspended spring-mass system via respective anchoring points. When a source voltage is applied to the suspended spring-mass system, the conductive components of that system will receive the applied voltage under normal conditions. If components are broken or damaged, one or more portions of the suspended spring-mass system may be isolated from the applied system voltage such that the system voltage is not received, or such that a voltage drop occurs. Any anchoring points that are connected via these isolated components will not receive the system voltage, and the received voltage may be sensed by measurement nodes located within the CMOS layer and connected to the anchoring points. Once the voltages at the measurement nodes are determined, processing may continue to step 608.

At step 608, the processing circuitry (e.g., hardware control logic such as hardware control circuitry of the processing circuitry) may identify an error based on the measured values at the monitoring nodes. In an embodiment, identifying an error may include determining that damage has occurred to the suspended spring-mass system, as well as identifying likely failed components within the suspended spring-mass system. For example, based on measurements from multiple measurement nodes it may be possible to identify particular components of the suspended spring-mass system that are damaged as described herein, and in some embodiments, to identify the extent of the damage to those components. If an error is identified, processing may then continue to step 610. If an error is not identified, processing may return to step 602 to perform additional measurements (e.g., with different anchoring points providing the source voltage).

At step 610, it may be determined whether to perform additional measurements on the suspended spring-mass system by applying the source voltage to different components (e.g., by switching the source/sense circuits). In some embodiments, the determination of whether to perform additional measurements may be based on the identified error from step 608, for example, based on a determined likelihood that a particular error has been accurately identified, the severity of the error, and whether there is a possibility of performing compensation. If additional measurements are not to be performed, processing may continue to step 612. If additional measurements are to be performed, processing may continue to step 614.

At step 614, the additional measurements may be performed by applying the source voltage through different anchoring points (e.g., by modifying the state of the source/sense circuits associated with particular anchoring points). In this manner, different circuit paths through the suspended spring-mass system may be tested to further determine which components have been damaged as well as the extent of such damage. In some embodiments, the additional measurements may be based on the initial identification of the error, e.g., they may be selected in order to further refine identification of a particular error. In other embodiments, each of the anchoring points may apply the source voltage (e.g., based on switching of the respective source/sense circuits) for a period of time. In some embodiments, once an error is initially identified (e.g., based on applying the system voltage), other voltage patterns may be applied to the suspended spring-mass system to identify the source of the error. Once the additional measurements have been performed, processing may continue to step 616.

At step 616, it may be determined based on the iterative measurements at the measurement nodes whether it is possible to compensate for the error. This determination may be made based on identification of the error as well as other available resources (e.g., other axes that may available to sense motion) that may be used to assist in compensation. If compensation is to be performed processing may continue to step 618. If compensation is not to be performed, processing may continue to step 612.

At step 618, compensation may be performed. In some embodiments, the MEMS device may be able to continue to measure the damaged axes by modifying the operation of the MEMS device (e.g., by modifying drive forces, changing sense scaling factors, etc.). In some embodiments such as a multi-axis gyroscope or accelerometer, it may be possible to continue to operate and measure certain axes that are isolated from the damaged components. For multi-axis devices (e.g., including three axes of gyroscope sensing and three axes of accelerometer sensing), sensor fusion may be used to estimate values for a missing axis or to compensate based on measured values from an axis including one or more damaged components. Once the compensation has been implemented, processing may continue to step 620.

At step 612, it may have been determined that a failure should be determined and that the operation of the MEMS device should cease. The MEMS device that has been damaged may be shut down, and processing may continue to step 620.

At step 620, a notification may be provided indicating that an error has occurred within the suspended spring-mass system or that compensation is being employed within the suspended spring-mass system. In an embodiment, a notification may be provided indicating information such as the type of error, identification of damaged components, measured values for drive and sense forces (including from other sensors/axes) at a time preceding and including when the components were damaged, compensation techniques employed, the sequence of connections points that was used to identify the error, other suitable information relating to the MEMS device including the suspended spring-mass system, and any suitable combination thereof. In some embodiments, the notifications may be provided to a remote system that determines information about a variety of sensors to identify failure modes, modifies compensation techniques, and performs other analysis based on long-term trends of information relating to failures that may be identified from the notifications. Once the notification is provided, the steps of FIG. 6 may end.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A microelectromechanical sensor, comprising:
   a plurality of anchoring points;
   a suspended spring-mass system, comprising:
   a plurality of movable masses;
   a plurality of springs coupling the plurality of movable masses to each other and to suspend the plurality of movable masses from the plurality of anchoring points, wherein the plurality of moving masses and the plurality of anchoring points are electrically connected by the plurality of springs;
   a first voltage source coupled to apply a system voltage level to the suspended spring-mass system via a first anchoring point of the plurality of anchoring points;
   a measurement node coupled to a second anchoring point of the plurality of anchoring points to measure a voltage of the second anchoring point; and
   processing circuitry configured to identify an error of the suspended spring-mass system based on the measured voltage.

2. The microelectromechanical sensor of claim 1, wherein the measured voltage comprises a first measured voltage, further comprising an additional measurement node coupled to measure a second measured voltage via a third anchoring point of the plurality of anchoring points, wherein the processing circuitry is further configured to identify the error of the suspended spring-mass system based on the second measured voltage.

3. The microelectromechanical sensor of claim 2, wherein the error comprises one or more damaged components of the suspended spring-mass system, and wherein the processing circuitry is further configured to identify a first subset of possible damaged components of the suspended spring-mass system based on the first measured voltage, and to identify a second subset of possible damaged components of the suspended spring-mass system based on the second measured voltage.

4. The microelectromechanical sensor of claim 3, wherein the processing circuitry is configured to identify the first subset of possible damaged components when the first measured voltage differs from the system voltage level by more than an error threshold voltage and the second measured voltage is within the error threshold voltage of the system voltage level, and to identify the second subset of possible damaged components when the second measured voltage differs from the system voltage level by more than the error threshold voltage and the first measured voltage is within the error threshold voltage of the system voltage level.

5. The microelectromechanical sensor of claim 4, wherein the error threshold voltage is based on a percentage change from the system voltage level.

6. The microelectromechanical sensor of claim 2, wherein the processing circuitry is further configured to take a first corrective action if the error is identified based on the first measured voltage and to take a second corrective action if the error is based on the second measured voltage.

7. The microelectromechanical sensor of claim 6, wherein the first corrective action comprises the processing circuitry being further configured to disable the microelectromechanical sensor, and wherein the second corrective action comprises the processing circuitry being further configured to modify the operation of the microelectromechanical sensor.

8. The microelectromechanical sensor of claim 7, wherein the modification of the operation of the microelectromechanical sensor comprises a modification of a sense scaling factor of the processing circuitry or a modification of a drive voltage applied to one of the plurality of movable masses.

9. The microelectromechanical sensor of claim 1, wherein the processing circuitry is configured to identify the error of the suspended spring-mass system based on a difference between the measured voltage and the system voltage level.

10. The microelectromechanical sensor of claim 1, wherein the voltage source applies the system voltage level from the first anchoring point to the suspended spring-mass system via a first spring of the plurality of springs, and wherein the first spring of the plurality of springs is located in series between the first anchoring point and the other components of the suspended spring-mass system.

11. The microelectromechanical sensor of claim 10, wherein the measurement node receives the measured voltage via a second spring of the plurality of springs and the second anchoring point, and wherein the second spring is located in series between the first anchoring point and the second anchoring point.

12. The microelectromechanical sensor of claim 1, wherein the measured voltage comprises a second measured voltage and wherein the measurement node comprises a second measurement node, further comprising:
a second voltage source coupled to apply the system voltage level to the suspended spring-mass system via the second anchoring point;
a first measurement node coupled to the first anchoring point to measure a first measured voltage of the first anchoring point;
a first switch coupled to the first anchoring point to selectively couple the first anchoring point to the first voltage source or to the first measurement node; and
a second switch coupled to the second anchoring point to selectively couple the second anchoring point to the second voltage source or the second measurement node.

13. The microelectromechanical sensor of claim 12, wherein the processing circuitry is further configured to cause one of the first switch or the second switch to provide the system voltage level to the suspended spring-mass system and to cause the other of the first switch or the second switch to couple the first anchoring point to the first measurement node or to couple the second anchoring point to the second measurement node, and to identify the error of the suspended spring-mass system based on a comparison of the system voltage level to the first measured voltage or the second measured voltage associated with the other of the first switch or the second switch.

14. The microelectromechanical sensor of claim 12, further comprising:
a third voltage source coupled to apply the system voltage level to the suspended spring-mass system from a third anchoring point;
a third measurement node coupled to measure a third measured voltage via the third anchoring point; and
a third switch coupled to the third anchoring point to selectively couple the third anchoring point to the third voltage source or the third measurement node.

15. The microelectromechanical sensor of claim 14, wherein the processing circuitry is further configured to cause the first switch to couple the first voltage source to provide the system voltage level to the suspended spring-mass system, to cause the second switch to couple the second anchoring point to the second measurement node to measure the second measured voltage, to cause the third switch to couple the third anchoring point to the third measurement node to measure the third measured voltage, and to identify an initial error of the suspended spring-mass system based on the second measured voltage and the third measured voltage.

16. The microelectromechanical sensor of claim 15, wherein the processing circuitry is further configured to cause the second switch to couple the second voltage source to provide the system voltage level to the suspended spring-mass system, to cause the first switch to couple the first anchoring point to the first measurement node to measure the first measured voltage, to cause the third switch to couple the third anchoring point to the third measurement node to measure a new third measured voltage, and to identify a refined error of the suspended spring-mass system based on the initial error, the first measured voltage, and the new third measured voltage.

17. The microelectromechanical sensor of claim 16, wherein the processing circuitry is further configured to cause the third switch to couple the third voltage source to provide the system voltage level to the suspended spring-mass system, to cause the first switch to couple the first anchoring point to the first measurement node to measure a new first measured voltage, to cause the second switch to couple the second anchoring point to the second measurement node to measure a new second measured voltage, and to identify a further refined error based on the refined error, the initial error, the new first measured voltage, and the new second measured voltage.

18. A method for identifying an error within a microelectromechanical sensor, the method comprising:
providing, from a first voltage source, a system voltage to a first anchoring point of a plurality of anchoring points;
applying, via the first anchoring point, a system voltage level to a suspended spring-mass system;
receiving, at a second anchoring point of the plurality of anchoring points, a received voltage via the suspended spring-mass system;
providing the received voltage from the second anchoring point to a measurement node; and
identifying, by processing circuitry, an error of the suspended spring-mass system based on the received voltage at the measurement node.

19. A microelectromechanical sensor, comprising:
a plurality of anchoring points;
a plurality of source/sense circuits, wherein each of the source sense circuits is coupled to one of the plurality of anchoring points, each source/sense circuit comprising:
  a voltage source;
  a measurement node; and
  a switch;
a suspended spring-mass system suspended from the plurality of anchoring points; and
processing circuitry configured to cause a first source/sense circuit to couple the voltage source of the first source/sense circuit to a first anchoring point of the plurality of anchoring points, to cause a second source/sense circuit couple a second anchoring point of the plurality of anchoring points to the measurement node of the second source/sense circuit, and to identify an error of the suspended spring-mass system based on a voltage received at the second measurement node.

* * * * *